(12) United States Patent
Muraishi

(10) Patent No.: US 7,226,847 B2
(45) Date of Patent: Jun. 5, 2007

(54) METHOD OF FORMING A SEMICONDUCTOR LASER CHIP HAVING A MARKER

(75) Inventor: Mitsumasa Muraishi, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 105 days.

(21) Appl. No.: 11/210,842

(22) Filed: Aug. 25, 2005

(65) Prior Publication Data

US 2006/0134851 A1 Jun. 22, 2006

Related U.S. Application Data

(62) Division of application No. 10/670,719, filed on Sep. 26, 2003, now Pat. No. 6,974,761.

(60) Provisional application No. 60/413,780, filed on Sep. 27, 2002.

(51) Int. Cl.
*H01L 21/46* (2006.01)

(52) U.S. Cl. ............... 438/462; 257/797; 257/E23.179

(58) Field of Classification Search ................ 438/401, 438/462, 975; 257/797
See application file for complete search history.

(56) References Cited

U.S. PATENT DOCUMENTS 5,284,792 A * 2/1994 Forster et al. ................ 438/29
6,853,042 B2 2/2005 Yoshida et al.

OTHER PUBLICATIONS

"Synonymous With Alignment-Optical Packaging", Journal of Japan Institute of Electronics Packaging, vol. 13, No. 1 (1988), pp. 54-56.

* cited by examiner

*Primary Examiner*—Quoc Hoang
(74) *Attorney, Agent, or Firm*—Rabin & Berdo, PC

(57) ABSTRACT

A method of manufacturing a semiconductor laser chip has following steps. First, a semiconductor substrate including an active layer and a block layer is provided. An electrode line pattern and a marker are formed on the semiconductor substrate. The semiconductor substrate is etched to form a W channel. Then, an oxide layer is formed on the semiconductor substrate to cover the electrode line pattern and the marker. A part of the oxide layer to form an electrode contact that exposes the electrode line pattern. A mounting electrode is formed on the electrode line pattern. Finally, the semiconductor substrate is divided into a plurality of semiconductor laser chip.

7 Claims, 2 Drawing Sheets

METHOD OF FORMING A SEMICONDUCTOR LASER CHIP HAVING A MARKER

This is a Divisional of allowed U.S. application Ser. No. 10/670,719, filed Sep. 26, 2003 U.S. Pat. No. 6,974,761, the subject matter of which is incorporated herein by reference. The rights of priority are claimed under 35 USC §119 of U.S. Provisional Application No. 60/413,780, filed Sep. 27, 2002.

BACKGROUND OF THE INVENTION

The present invention relates to a method of forming a semiconductor chip, and more specifically to formation of laser chip markers for passive alignment.

The passive alignment has been described in "Synonymous With Alignment-Optical Packaging", Journal of Japan Institute of Electronics Packaging, Vol. 13, No. 1 (1988), pp 54–56. While a visual type, a mechanical type, and a flip-chip type have been introduced for the passive alignment in the present Journal, the present invention relates to the visual type.

According to the above-described document, the visual type passive alignment is equivalent to one wherein a chip mounter adopted in die bonding of electronic components such as an LSI chip is made high in accuracy. Both a mounting board and an optical chip are provided with eye-alignment markers, and both positions thereof are detected by image recognition. Thereafter, a stage for holding the optical chip is moved to a predetermined position and fixed thereat.

The markers provided on the chip are respectively made up of a metal formed on a silicon oxide film on the surface of the chip. In general, the markers are provided plural per chip and respectively take easy-to-visually recognize shapes such as round shapes.

Since, however, the markers on the chip are formed on the silicon oxide film, they might produce imperfections that the metal surfaces of the markers are flawed, the shapes thereof are reduced or become large in reverse, or the markers are deformed and peeled as the case may be. When the imperfections occur in such markers, a problem arises in that the chip cannot be packaged on a mounting board due to passive alignment even if the chip per se is a non-defective item free of any problem in terms of its characteristic.

SUMMARY OF THE INVENTION

The present invention may provide a method for forming a semiconductor chip having chip markers with no flaws and free of the occurrence of deformation and peeling.

According to the present invention, chip markers are simultaneously formed of the same material as electrode lines for ohmic contacts. The so-formed markers are covered with a silicon oxide film for current narrowing.

According to the present invention as well, the chip markers are also formed as patterns void of the silicon oxide film for current narrowing.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

FIGS. 1(A) through 1(D) are forming process diagrams of a semiconductor chip, showing a first embodiment of the present invention.

Figure 1A:
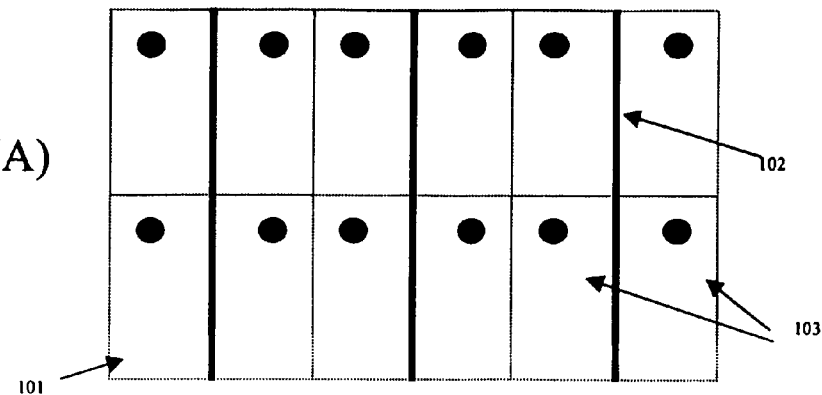
FIGS. 1(A) through 1(D) are respectively diagrams showing a method of forming a semiconductor chip, according to a first embodiment of the present invention.

As shown in FIG. 1(A), ohmic contact electrode lines 102 and markers 103 are first formed on the junction side of an InP substrate 101 having an active layer and a block layer. The ohmic contact electrode lines 102 and the markers 103 are respectively composed of AuZu and simultaneously formed by lift-off. Thereafter, sintering is performed to ensure ohmic contacts between the ohmic contact electrode lines 102 and the InP substrate 101.

Figure 1B:
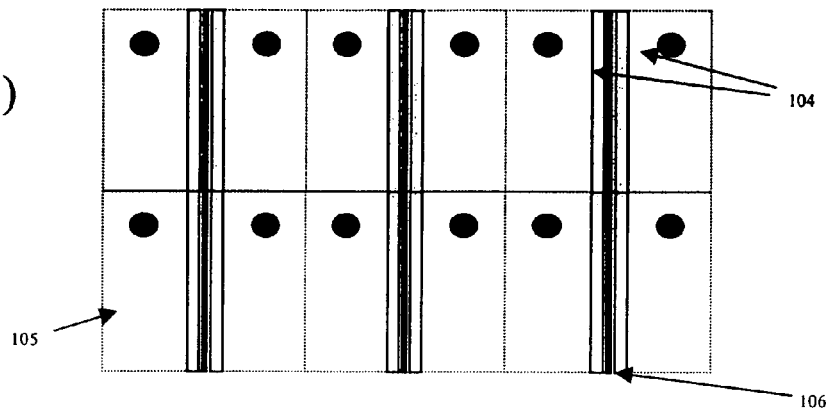

Next, as shown in FIG. 1(B), the InP substrate 101 is etched to form W channels 104. Thereafter, a silicon oxide film 105 for current narrowing is formed over the whole surface. Further, afterwards, the silicon oxide film 105 is etched to open line patterns 106 of electrode contact portions on their corresponding ohmic contact electrode lines 102.

Figure 1C:
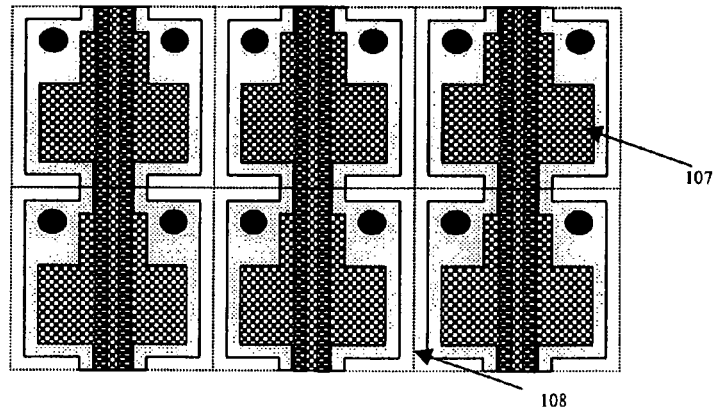

As shown in FIG. 1(C), mounting electrodes 107 are respectively formed on the line patterns 106 of the electrode contact portions so as to have electrical connections with the ohmic contact electrode lines 102. Portions formed as peripheral portions when the InP substrate 101 is diced into chip single bodies, are removed from the silicon oxide film 105. Thereafter, lines 108 for cleaving the silicon oxide film are formed on the InP substrate 101. Further, the InP substrate 101 is polished so as to reach 100 μm, so that unillustrated back electrodes are formed.

Figure 1D:
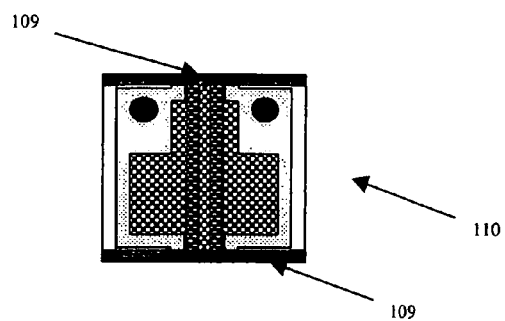

Finally, as shown in FIG. 1(D), bar cleavage is performed along the cleavage lines 108 to fractionalize the InP substrate 101 into semiconductor chip single bodies 110. Thereafter, end-face coats 109 are processed so as to be applied to the semiconductor chip single bodies 110, whereby each individual semiconductor chip 101 is formed.

According to the first embodiment of the present invention, as described above, since the laser chip markers 103 for passive alignment are covered with the silicon oxide film 105 for current narrowing, flaws in metal electrode portions of the markers 103, and marker peeling can be prevented from occurring.

Forming the markers 103 by the same mask as the ohmic contact electrode line 102 on the active layer makes it possible to hold the active layer and the markers 103 with high position accuracy. Also using the lift-off enables prevention of failures in the size and shape of each marker 103 due to variations in metal etching.

A second embodiment of the present invention will next be explained with reference to FIGS. 2(A) through 2(D). FIGS. 2(A) through 2(D) are forming process diagrams of a semiconductor chip, showing the second embodiment of the present invention.

Figure 2A:
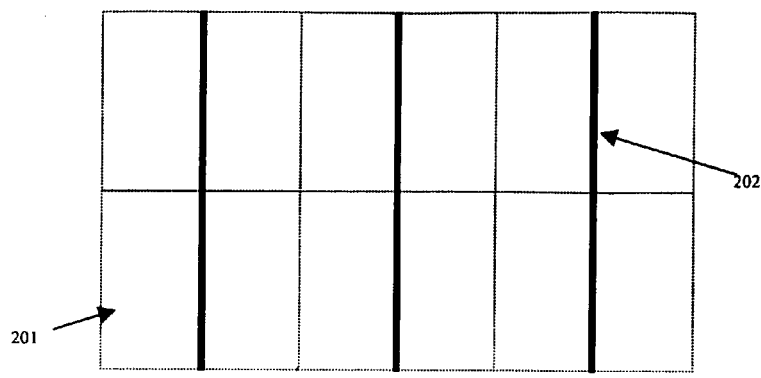
FIGS. 2(A) through 2(D) are respectively diagrams illustrating a method of forming a semiconductor chip, according to a second embodiment of the present invention.

As shown in FIG. 2(A), ohmic contact electrode lines 202 are first formed on the junction side of an InP substrate 201 having an active layer and a block layer. The ohmic contact electrode lines 202 are respectively composed of AuZu and formed by lift-off. Thereafter, sintering is performed to ensure ohmic contacts between the ohmic contact electrode lines 202 and the InP substrate 201.

Figure 2B:
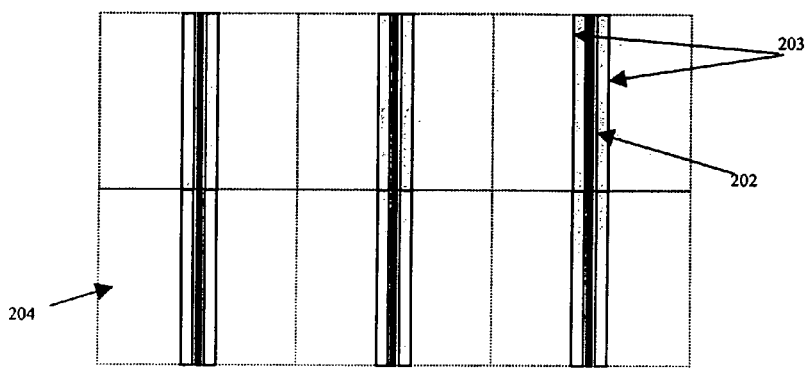
Figure 2C:
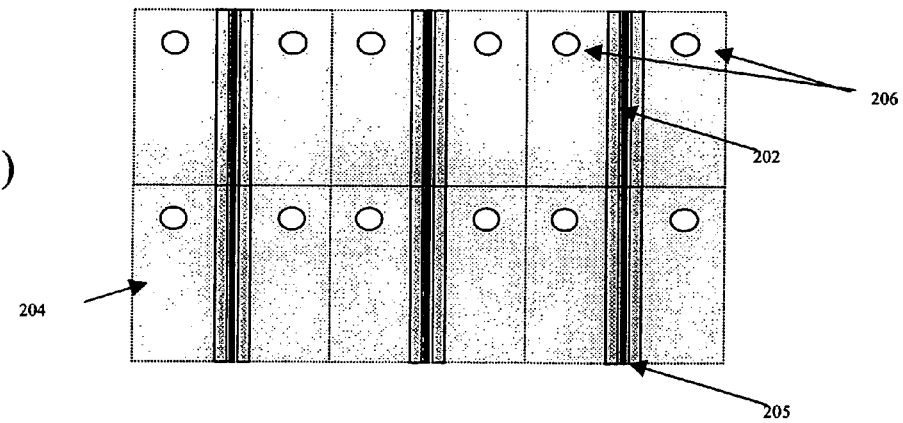
Figure 2D:
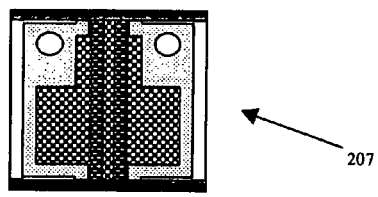

Next, as shown in FIG. 2(B), the InP substrate 201 is etched to form W channels 203. Thereafter, a silicon oxide film 204 for current narrowing is formed over the whole surface. Further, afterwards, as shown in FIG. 2(C), the silicon oxide film 204 is etched to simultaneously form line patterns 205 of electrode contact portions and markers 206 on their corresponding ohmic contact electrode lines 202. The markers 206 expose the InP substrate 201.

Thereafter, although not shown in the drawing in particular, mounting electrodes are respectively formed on the line patterns 205 of the electrode contact portions so as to have electrical connections with the ohmic contact electrode lines 202 in a manner similar to the first embodiment. Portions formed as peripheral portions when the InP substrate 201 is diced into chip single bodies, are removed from the silicon oxide film 204. Thereafter, lines for cleaving the silicon oxide film are formed on the InP substrate 201. Further, the InP substrate 201 is polished so as to reach 100 µm, so that unillustrated back electrodes are formed.

Finally, bar cleavage is performed along the cleavage lines to fractionalize the InP substrate 201 into semiconductor chip single bodies 207. Thereafter, end-face coats are processed so as to be applied to the semiconductor chip single bodies 207, whereby each individual semiconductor chip is formed.

According to the second embodiment of the present invention, as described above, the silicon oxide film 204 is removed so that the InP substrate 201 is exposed, whereby the markers 206 are formed. It is therefore possible to prevent the occurrence of flaws liable to be formed on a metal, and an imperfection in contrast at a metal portion due to image processing. Further, since the markers 206 are of void patterns, peeling does not occur either.

Since the line patterns 205 of the electrode contact portions and the markers 206 are simultaneously formed on the ohmic contact electrode lines 202, the position accuracy of each marker can be also held high.

When multilayer films are used for a dielectric material such as the silicon oxide film for current narrowing in the first embodiment described above, the markers may be formed between the multilayer films.

In the second embodiment, the markers may be formed by etching simultaneously with the formation of the cleavage lines.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor laser chip comprising:

providing a semiconductor substrate including an active layer and a block layer;

forming an electrode line pattern on the semiconductor substrate;

etching the semiconductor substrate to form a W channel;

forming an oxide layer on the semiconductor substrate;

removing a part of the oxide layer to form an electrode contact that exposes the electrode line pattern and a marker that exposes the semiconductor substrate;

forming a mounting electrode on the electrode line pattern; and dividing the semiconductor substrate into a plurality of semiconductor laser chip.

2. A method of manufacturing a semiconductor laser chip according to claim 1, wherein the electrode line pattern is formed at a junction side of the semiconductor substrate.

3. A method of manufacturing a semiconductor laser chip according to claim 1, wherein the semiconductor substrate is an InP substrate.

4. A method of manufacturing a semiconductor laser chip according to claim 1, further comprising performing a sintering so as to ensure an ohmic contact between the electrode line pattern and the semiconductor substrate.

5. A method of manufacturing a semiconductor laser chip according to claim 1, wherein the electrode line pattern is formed of AuZu.

6. A method of manufacturing a semiconductor laser chip according to claim 1, further comprising etching the oxide layer at a portion that is a peripheral region of the semiconductor laser chip.

7. A method of manufacturing a semiconductor laser chip according to claim 1, further comprising coating an end surface of the semiconductor laser chip.

* * * * *